(12) United States Patent
Chou et al.

(10) Patent No.: US 8,519,765 B2
(45) Date of Patent: Aug. 27, 2013

(54) METHOD AND APPARATUS FOR SIGNAL PHASE CALIBRATION

(75) Inventors: Mao-Hsuan Chou, Xinfeng Township (TW); Min-Shueh Yuan, Taipei (TW); Chih-Hsien Chang, New Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 195 days.

(21) Appl. No.: 13/228,508

(22) Filed: Sep. 9, 2011

(65) Prior Publication Data

US 2013/0063181 A1     Mar. 14, 2013

(51) Int. Cl.
    *H03H 11/16* (2006.01)
(52) U.S. Cl.
    USPC .............. 327/236; 327/233; 327/235
(58) Field of Classification Search
    USPC .............. 327/2, 3, 7, 9, 10, 12, 233–236
    See application file for complete search history.

(56) References Cited

U.S. PATENT DOCUMENTS

| 7,759,997 B2 * | 7/2010 | Fiedler | 327/233 |
| 8,294,501 B1 * | 10/2012 | Thomas et al. | 327/237 |
| 8,400,196 B2 * | 3/2013 | Kim | 327/156 |

* cited by examiner

*Primary Examiner* — Patrick O'Neill
(74) *Attorney, Agent, or Firm* — Duane Morris LLP (57) ABSTRACT

A method for signal phase calibration includes providing multiple periodic clock signals, including a reference signal and multiple phase shifted versions of the reference signal. The signals have a common frequency and are shifted from one another by multiples of a phase offset. An edge of a first signal is detected. The first signal is one of multiple phase shifted versions of the reference signal. The edge is a transition from a first logic value to a second logic value. The second logic value of the first signal is compared, upon detection of the edge, to a logic value of a second signal that is one of the first plurality of periodic clock signals other than the first signal. An inversion of the first signal is selectively provided based on an outcome of the comparison.

23 Claims, 7 Drawing Sheets

METHOD AND APPARATUS FOR SIGNAL PHASE CALIBRATION

BACKGROUND

Digital clock signals are commonly used to synchronize functionality of circuit components in a variety of applications. In some applications, a clock signal is provided along with copies of the signal shifted in phase by various offsets. For example, in a phase locked loop, a voltage controlled oscillator (VCO) may provide a four-bit output corresponding to periodic binary clock signal and versions of that clock signal shifted by 90, 180, and 270 degrees, respectively. In some contexts, such a four-bit signal (which may equivalently be considered as four one-bit signals) may be used to generate a lower frequency clock, e.g., using a clock divider such as a divide-by-2 circuit. For example, the four-bit VCO output may be processed by a divide-by-2 circuit to yield an eight-bit signal at half the frequency of the four bit signal. In other words, the four bits of the VCO output, which may be considered as four one-bit signals at 0, 90, 180, and 270 degrees phase offset, respectively, is processed to yield eight one-bit signals at phase offsets of 0, 45, 90, 135, 180, 225, 270, and 315 degrees, respectively, each at half the frequency of the original four signals.

Such a divide-by-two circuit may be implemented using a logic element such as a D flip-flop (DFF). A DFF has a data (D) input, an output Q and its complementary output QBAR, where QBAR may be coupled to the D input, a clock input, and an enable input. The DFF is triggered on a clock edge (e.g., a positive edge of the clock input, representing a transition from logic '0' to logic '1') so that the value at the D input (the value at QBAR before the edge) is provided as output Q. When a periodic clock signal with frequency f is provided as the clock input, the Q output is a periodic clock signal with frequency f/2.

Four such divide-by-two circuits may implement the example described above regarding VCO output signals at phase offsets of 0, 90, and 180 and 270 degrees, referred to as HF0, HF90, HF180, and HF270 because they are relatively high frequency. A first divide-by-two circuit processes HF0 to yield a lower frequency (half the frequency of HF0) signal LF0 and its 180-degree-shifted variant LF180 (because the Q and QBAR outputs of a DFF are 180 degrees out of phase); a second divide-by-two circuit processes HF90 to yield LF45 and LF225; a third divide-by-two circuit processes HF180 to yield LF90 and LF270; and a fourth divide-by-two circuit processes HF270 to yield LF135 and LF315.

Timing of the activation (enabling) of divide-by-two circuits affects the functionality in such an implementation. A DFF that implements a divide-by-two circuit may initially be in one of two states, and the output of the DFF depends on the initial state. Therefore, there are two possibilities for the output, one correct and one incorrect, In other words, activating the four DFFs described above during the wrong time interval may cause the output signals of the DFFs to not have the desired phase relationship. For example, suppose HF0 has period T and has a rising edge at time $t_r$. If the four DFFs that implement the divide-by-two circuits are enabled during the quarter period preceding that rising edge (i.e., between times $t_r-T/4$ and $t_r$), then the LF0, LF45, LF90 and LF135 outputs provided by respective divide-by-two circuits may have the correct (desired) phase relationships, i.e., a rising edge of LF0 aligned with the rising edge of HF0 at time $t_r$, a rising edge of LF45 at time $t_r+T/4$ to trail LF0 by 45 degrees, a rising edge of LF90 at time $t_r+T/2$ to trail LF0 by 90 degrees, and a rising edge of LF135 at time $t_r+3T/2$ to trail LF0 by 135 degrees.

However, if the DFFs are enabled during the wrong interval (e.g., between times $t_r$ and $t_r+T/2$), the outputs of the divide-by-two circuits may not have the correct phase relationships. If the outputs of the divide-by-two circuits are out of phase, timing errors may propagate to other circuit elements.

BRIEF DESCRIPTION OF THE DRAWINGS

The following will be apparent from elements of the figures, which are provided for illustrative purposes and are not necessarily to scale.

DETAILED DESCRIPTION

This description of certain exemplary embodiments is intended to be read in connection with the accompanying drawings, which are to be considered part of the entire written description.

Various embodiments of the present disclosure address the foregoing deficiencies of the prior art and provide phase calibration, e.g., to ensure that the low frequency (LF) signals have the correct phase relationships to one another in the example above.

Figure 1A:
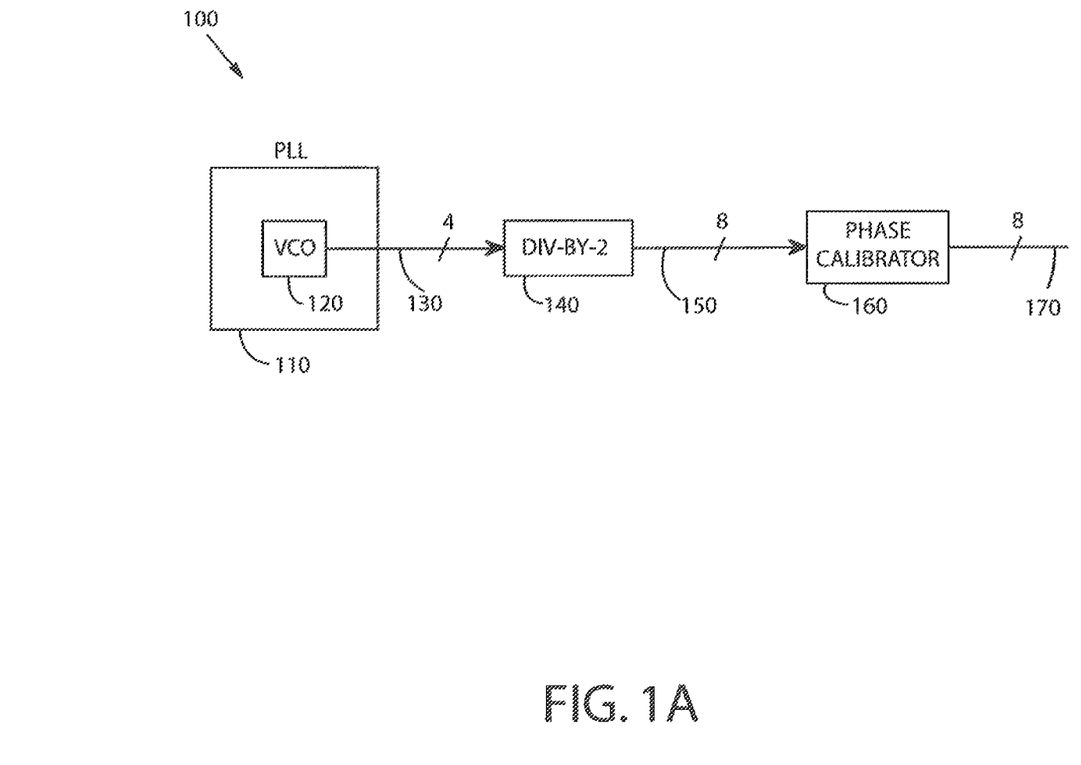
FIG. 1A is a block diagram of a phase calibration apparatus in accordance with various embodiments of the present disclosure.

FIG. 1A is a block diagram of a phase calibration apparatus 100 in accordance with various embodiments of the present disclosure. Apparatus 100 includes a phase locked loop (PLL) 110, a clock divider 140, and a phase calibrator 160. A voltage controlled oscillator (VCO) 120 of the PLL provides a four-bit output signal 130, which includes a periodic clock signal and phase shifted versions of that signal. In this example, a four-bit signal 130 is provided, which may provide a clock signal (referred to as a reference clock signal) and phase shifted versions thereof at offsets of 90, 180, and 270 degrees; in other examples, signal 130 may be configured differently, e.g., as an 8-bit signal providing a clock signal and phase shifted versions offset by multiples of 45 degrees. Clock divider 140, which may be a divide-by-two circuit, provides an eight-bit signal 150. The eight bits of signal 150 may represent a clock signal and seven phase shifted versions thereof offset by multiples of 45 degrees, with each of these eight signals having a period that is twice the period of the four clock signals 130. Some of the eight signals 150 may not conform to the desired phase sequence as described above. A phase calibrator 160 calibrates the phases of the signals to provide an eight-bit signal 170, with the eight signals represented by the eight bits having correct phase sequencing, e.g., such that rising edges of respective signals in the sequence of eight signals occur 45 degrees in phase after one another.

Figure 1B:
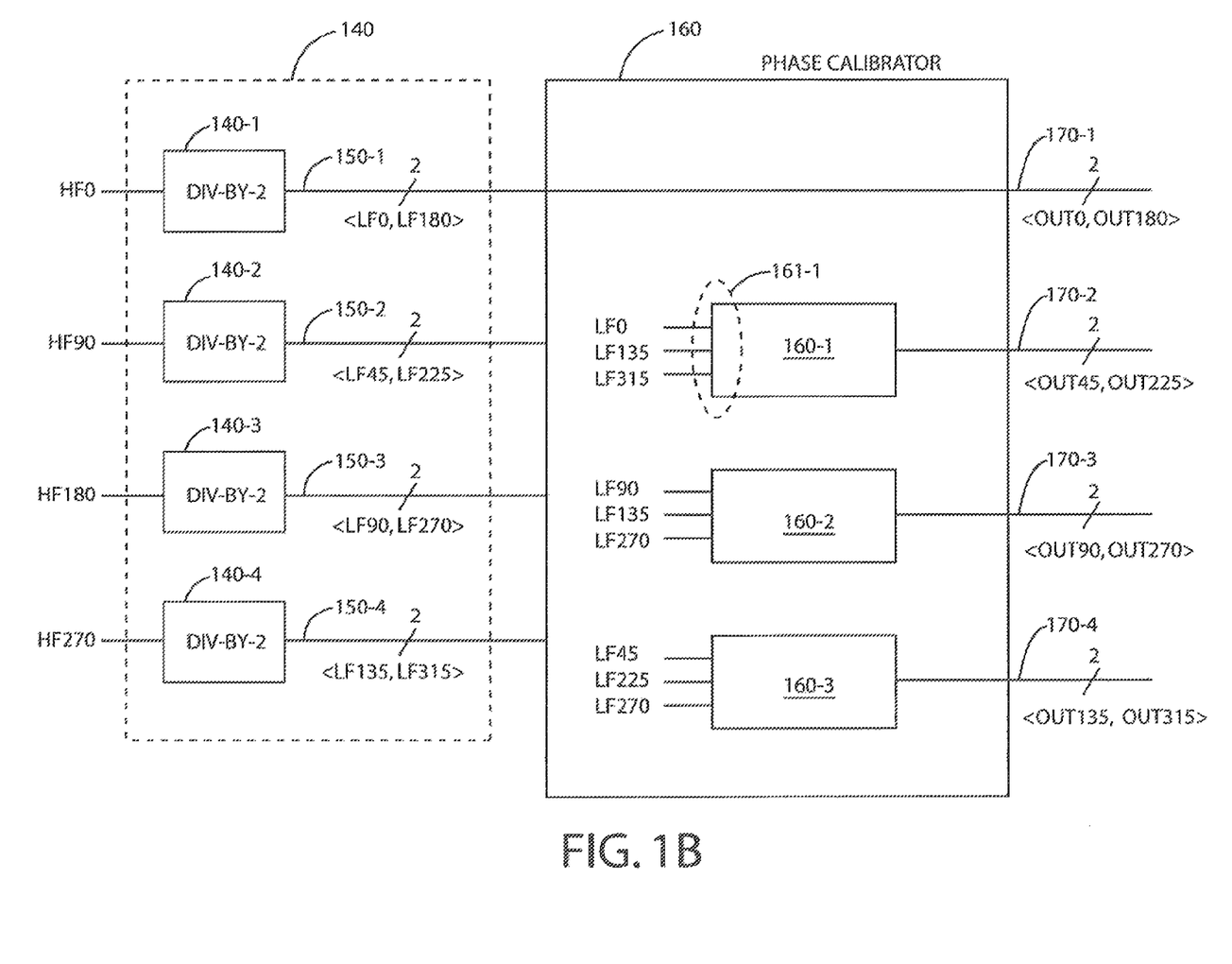
FIG. 1B is a block diagram of a phase calibration apparatus in accordance with various embodiments, with signal pairs corresponding to individual clock dividers shown.

FIG. 1B is a block diagram of a phase calibration apparatus in accordance with various embodiments, with signal pairs corresponding to individual clock dividers shown. FIG. 1B shows additional detail regarding the divide-by-two-circuit 140 and phase calibrator 160 of FIG. 1A. The four-bit signal 130 provided as an input to divide-by-two-circuit 140 may be processed as four single-bit channels, labeled HF0, HF90, HF180 and HF270, respectively. HF0 is a periodic binary clock signal, and the label "HF0" signifies that this signal has a relatively high frequency (compared to downstream processing) and that the signal is a reference clock signal that may be considered as a 0 degrees phase standard against which other signals may be compared in phase. A divide-by-two circuit 140-1 processes HF0 to yield a two-bit signal 150-1, of which the two bits may be considered separately as a binary signal LF0 and a binary signal LF180. "LF" in these designations indicates that these signals have a relatively lower frequency (half the frequency) compared to the HF signals, and "0" and "180" indicate that LF0 has zero phase offset (is a reference clock) and LF180 trails the reference (LF0) by 180 degrees, i.e., LF180 is the complement of LF0. Because LF0 is a reference (due to HF0 being a reference), it is axiomatic that the phase for LF0 (and hence for LF180, its logical inversion) is correct (i.e., LF0 and LF180 are regarded as correct). Therefore, no phase calibration is required for the signal pair <LF0, LF180>, and an output signal pair 170-1 denoted <OUT0, OUT180> is provided as shown.

Signal HF90 is processed by divide-by-two circuit 140-2 to yield two-bit signal 150-2, which comprises two one-bit signals LF45 and LF225. For signals LF45, LF90, LF135, LF225, LF270, and LF315 shown in FIG. 1B, the numerals following "LF" in these designations serve to distinguish these signals from one another; for convenience, these signals are collectively termed LF signals. These numerals also indicate desired phase relationships relative to LF0; for example, it is desired that LF45 trail LF0 by 45 degrees. However, some of these signals may actually be out of phase (by 180 degrees relative to the corresponding desired phase) due to dependence on the initial state of a logic element that may have one of two possible states when the logic element is enabled. For example, LF45 might actually trail LF0 by 225 degrees, not by the desired 45 degrees. In that case, LF225 would also be incorrect, trailing LF0 by 45 degrees instead of 225 degrees. Such an error, if not corrected, may lead to timing errors elsewhere in circuit applications. Phase calibration module 160-1 processes certain LF signals to yield signals OUT45 and OUT225, which correctly trail OUT0 by 45 and 225 degrees, respectively. In this example, module 160-1 takes as inputs LF0, LF135, and LF315 at an input interface 161-1. Details of processing performed at module 160-1 are provided further below.

Similarly, divide-by-two circuits 150-3 and 150-4 process HF180 and HF270 to yield two-bit signals 150-3 and 150-4, respectively, which signals represent the pairs <LF90, LF270> and <LF135, LF315> that may not be in conformance with the desired phase sequencing. Accordingly, calibration modules 160-2 and 160-3 provide calibrated signals 170-3 and 170-4, which represent the pairs <OUT90, OUT270> and <OUT135, OUT315>, respectively, where the numerals following "OUT" in these signals indicate the phase by which each signal trails OUT0.

Figure 2A:
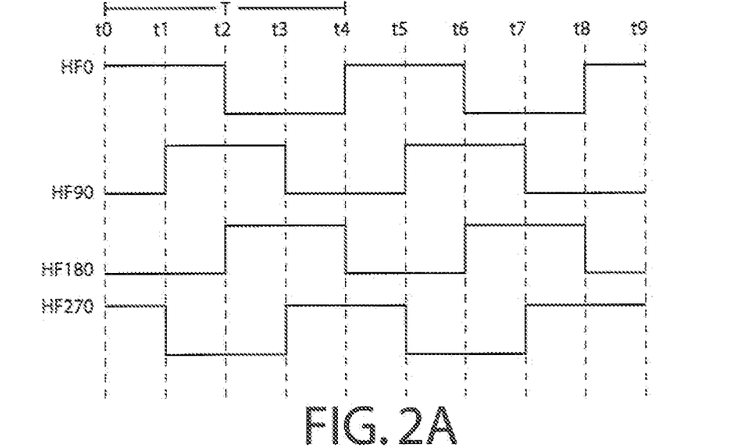
FIG. 2A is a signal trace diagram of clock divider inputs in accordance with various embodiments.

FIG. 2A is a signal trace diagram of clock divider inputs (respective bits of signal 130 provided as input to divider 140 of FIG. 1A) in accordance with various embodiments. Signal HF0 is a periodic binary clock signal with period T, where $T=t_4-t_0$ as shown. Signals HF90, HF180, and HF270 trail HF0 by 90, 180, and 270 degrees, respectively.

Figure 2B:
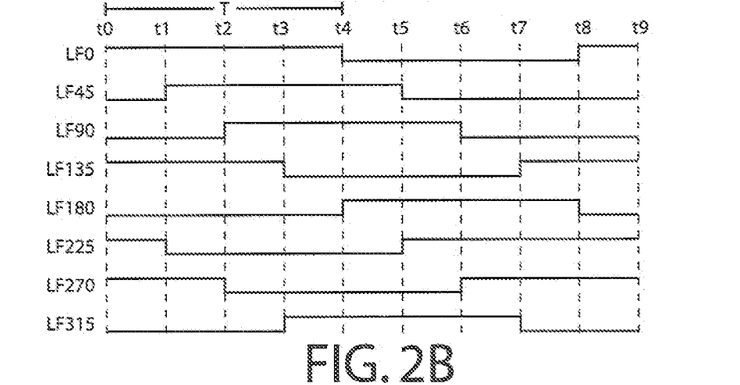
FIG. 2B is a signal trace diagram of clock divider outputs in accordance with various embodiments, with incorrect phase sequencing.

FIG. 2B is a signal trace diagram of clock divider outputs (respective bits of signal 150 provided as output by divider 140 of FIG. 1A) in accordance with various embodiments. The desired phase sequencing is for LF45 to trail LF0 (the reference clock) by 45 degrees, LF90 to trail LF0 by 90 degrees, etc. However, in this example LF135 has a falling, not rising, edge at time $t_3$, and thus trails LF0 by 315, not 135, degrees. LF180, LF225, and LF270 exhibit the correct (desired) phase sequencing, and LF315 (the logical inversion of LF135, i.e., the 180 degree phase-shifted version of LF135) is also out of phase. Ordinarily, these phase errors would result in errors for prior art systems.

Figure 2C:
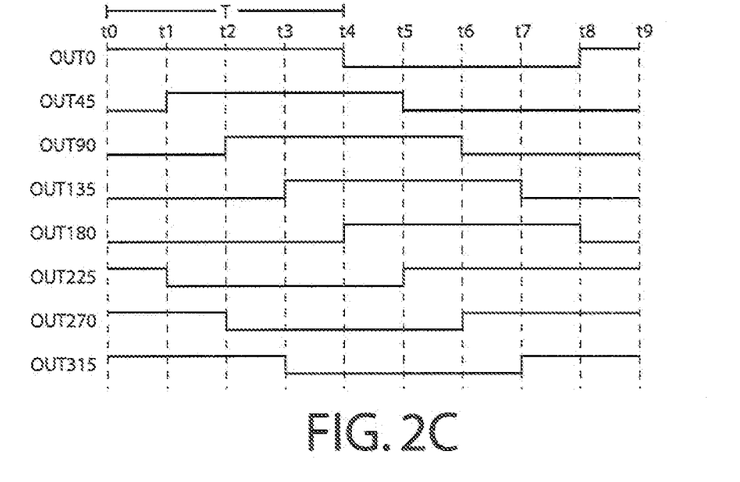
FIG. 2C is a signal trace diagram of calibrated clock signals in accordance with various embodiments, with the phases of the signals calibrated to provide signals that are offset in phase from a reference signal by multiples of a phase offset.

FIG. 2C is a signal trace diagram of calibrated clock signals corresponding to respective bits of signal 170 in accordance with various embodiments, with the phases of the signals calibrated to provide signals that are offset in phase from a reference signal by multiples of a phase offset. OUT0 is the same as LF0 and is a reference clock (i.e., with zero phase by convention). OUT45 trails OUT0 by 45 degrees, OUT90 trails OUT0 by 90 degrees, etc. Details of phase calibrator 160 that provide this correct phase sequencing are provided further below.

Figure 3:
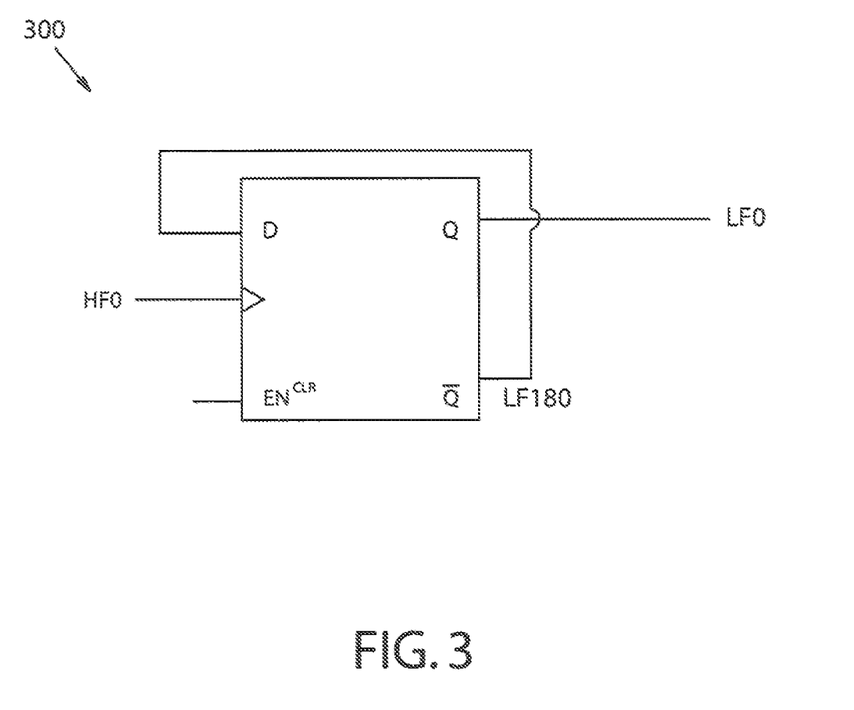
FIG. 3 is a logic element implementing a clock divider in accordance with various embodiments.

FIG. 3 is an example D flip-flop (DFF) implementation of divide-by-two circuit 140-1 in accordance with various embodiments. DFF 300 is triggered by a rising edge of signal HF0. DFF 300 has a data (D) input coupled to QBAR output LF180, and a Q output provides LF0. A similar DFF implementation may be used for divide-by-two circuits 140-2, 140-3, and 140-4, with the appropriate HF and LF signals configured as shown in FIG. 1B.

Figure 4:
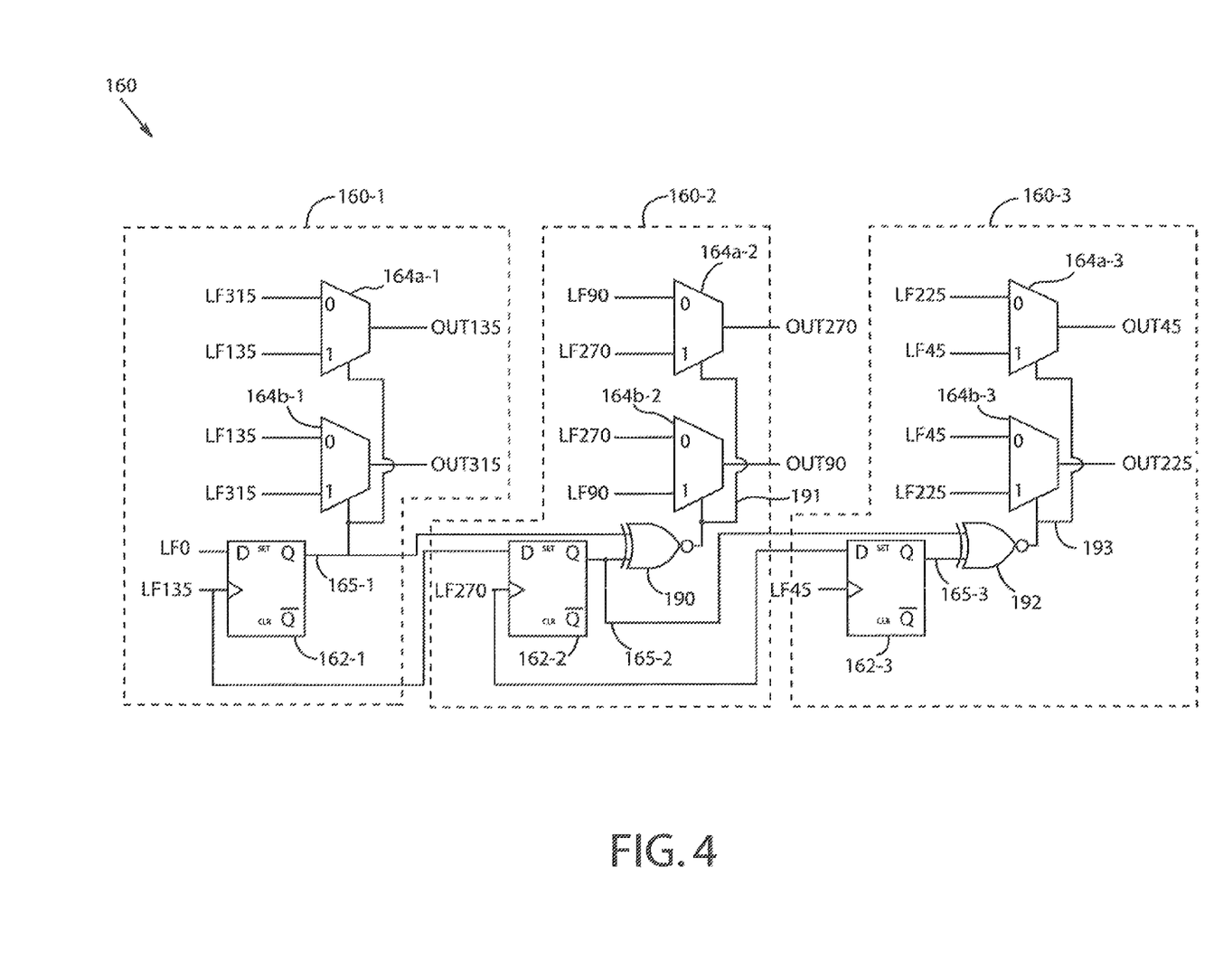
FIG. 4 is a schematic diagram of a multistage phase calibrator in accordance with various embodiments.

FIG. 4 is a schematic diagram of a multistage phase calibrator in accordance with various embodiments. FIG. 4 shows details of an example implementation of phase calibrator 160 of FIG. 1B. At each of three stages, a phase detection module and a phase selection module are provided. The stages are organized in a predetermined order, e.g., with each stage other than the first stage coupled to a predecessor stage. For example, at a first stage corresponding to module 160-1, a phase detector may be formed by a DFF 162-1, which may be a rising edge triggered DFF. At a rising edge of LF135, the logic value of LF0 is provided at the Q output as signal 165-1. For example, referring to FIG. 2B, LF135 changes from low ('0') to high ('1') at time $t_7$. The value of LF0 ('0') is then transferred to signal 165-1. Based on the comparison between LF0 and LF135 provided by the phase detector, a phase selector formed by multiplexors (muxes) 164a-1 and 164b-1 corrects the phase sequencing if appropriate. In this example, signal 165-1 is low as described above, causing the LF315 input of mux 164a-1 to be passed through to the output of that mux as OUT135, and causing the LF135 input of mux 164b-1 to be passed through to the output of that mux as OUT315. In other words, because the logic value of LF135 at the instant after time $t_7$ is different from the logic value of LF0, a phase error is detected. The detected error is corrected by providing an inversion of LF135 (namely, LF315) as OUT135, and by providing an inversion of LF315 (namely, LF135) as OUT315. If LF0 had instead been high ('1') at time $t_7$, signal 165-1 would have been high, and OUT135 and OUT315 would have been set to LF135 and LF315, respectively (i.e., no correction would have been required in that case).

One of ordinary skill in the art will understand that functionality provided by muxes 164a-1 and 164b-1 that are selected by signal 165-1 may be implemented in various other ways. For example, in some implementations, only one of these muxes may be present (e.g., to provide OUT135), and an inverter may be coupled to an output of that mux (e.g., to invert OUT135 to provide OUT315).

At a second stage corresponding to module 160-2, a phase detector formed by DFF 162-2 functions in a similar manner as DFF 162-1. At a rising edge of LF270, the value of LF135 is provided at the Q output as signal 165-2. Phase selection to provide OUT270 and OUT90 is also similar to processing at module 160-1, but exclusive-NOR (XNOR) gate 190 accounts for the phase error previously detected at LF135. In other words, LF270 is compared against LF135 to determine whether LF270 or its inversion LF90 is to be provided as OUT270, but the fact that LF135 was itself determined to be out of phase is accounted for by XNOR gate 190. Due to output signal 191 of XNOR gate 190 and muxes 164a-2 and 164b-2, inversion is effected at module 160-2 (inverting LF90 to provide OUT270, and inverting LF270 to provide OUT90) only if signal 165-1 and signal 165-2 have different values. This is understood by considering the different logical possibilities. If signals 165-1 and 165-2 are both '0', then an incorrect phase was detected at both the previous stage (stage 1) and the current stage (stage 2). However, the detection at the current stage was premised on an incorrect basis for comparison at the previous stage, so no correction is appropriate at the current stage. XNOR gate 190 yields an output signal 191 of '1', which selects the LF270 input of mux 164a-2 to be provided as OUT270 (i.e., does not invert LF270 to yield OUT270) and the LF90 input of mux 164b-2 to be provided as OUT90 (i.e., does not invert LF90 to yield OUT90). If signal 165-1 is '0' and signal 165-2 is '1', then an incorrect phase was detected at the previous stage, and the apparently correct detection at the current stage is actually wrongly premised, so correction is appropriate at the current stage. XNOR gate 190 yields '0' for output signal 191, which causes muxes 164a-2 and 164b-2 to invert LF270 and LF90, respectively, to yield OUT270=LF90 and OUT90=LF270. Similarly, if signal 165-1 is '1' and signal 165-2 is '0', then correct phase was detected at the previous stage and an incorrect phase was detected at the current stage. The value of '0' at signal 191 effects inversion at muxes 164a-2 and 164b-2. If signals 165-1 and 165-2 are both '1', then correct phase sequencing was detected at both the previous and current stages, so no correction is appropriate at the current stage. The resulting value of '1' for output signal 191 has the same effect as for the case where signals 165-1 and 165-2 are both '0', i.e., no inversion at the muxes. Thus, output signal 191 provides an indication of an inversion that may have been provided by the phase selector of the predecessor stage (the first stage).

Phase calibration module 160-3 is configured in a similar manner as module 160-2, as shown in FIG. 4. At a rising edge of LF45, the value of LF270 is provided at the Q output as signal 165-3. Inversion is selectively provided in a similar manner as in the second stage.

Because each of the three stages ensures that two clock signals are calibrated (corrected) in phase, the six signals other than the reference signal OUT0 and OUT180 are generated by these three stages. Thus, three stages suffice to calibrate all eight signals in this example. Here, pairs of signals that were intended (desired) to be 135 degrees apart in phase were compared at the respective stages (e.g., LF0 and LF135 at stage 1; LF135 and LF270 at stage 2; LF270 and LF45 at stage 3). In the general case of an N-phase clock system where signal 130 has a bit length of N, using a phase difference of 180-360/N degrees as the basis for such comparisons yields the minimum number of phase calibration modules (like 160-1, 160-2, 160-3) as N/2-1. In the example N=4 considered above, it is noted that 180-360/N=135 and N/2-1=3. N may be various numbers in different implementations.

The choice of phase difference 180-360/N may be understood as follows. The reference signal LF0 is considered to be correct (no calibration required) by convention. LF135, if correctly calibrated to begin with, would change from low to high at a time when LF0 is already high, because LF135 trails LF0 by less than 180 degrees. LF135 may be compared against LF90 or LF45 in other embodiments (e.g., LF90 or LF45 may serve the role of the D input to the phase detector at module 160-1), but then additional calibration modules would be needed due the closer spacing between compared signals. Thus, the phase difference for comparison may be 45 or 90 degrees rather than 135 as in the example above, but additional circuitry is needed in those embodiments.

In other embodiments, LF135 may be compared against LF180, LF225, or LF270. For example, upon a rising edge of LF135, signal LF180 (or LF225 or LF270) may be checked. If LF 180 (or LF225 or LF270) is low at that time, then LF135 is correct, and no inversion is needed, otherwise LF135 and LF315 may be inverted to provide OUT315 and OUT135, respectively. Thus, LF135 may be compared against any signal except LF315, which is known a priori to be a logical inversion of LF135. Similar reasoning applies to other signals than LF135.

One of ordinary skill in the art will recognize that variations on the above implementations are possible based on elementary logic. For example, the phase detectors may be negative edge triggered (triggered by falling edges) instead of positive edge triggered. For example, on a falling edge of LF135, LF0 may be checked; inversion is effected only if LF0 is low.

In another embodiment, the calibration modules 160-2 and 160-3 may be implemented without XNOR gates. Referring to FIG. 4, the D input of DFF 162-2 may be coupled to OUT135 instead of to LF135, and the D input of DFF 162-3 may be coupled to OUT270 instead of to LF270. If LF135 does not trail LF0 by 135 degrees, then an inversion of LF135 (e.g., LF315) is provided as OUT135, and OUT135 may be referred to as an inversion signal with respect to LF135 in that case. Thus, the second stage calibration module 160-2 is configured to receive an inversion signal (OUT135 in that case) provided by the phase selector of the predecessor stage (the first stage, calibration module 160-1). Coupling a phase detector to a corrected (calibrated) signal such as OUT135 eliminates the need to check whether an inversion was effected in a previous comparison; however, additional delay is incurred due to the processing flow through muxes in that case. Thus, less circuitry elements may be used (which may decrease cost) at the expense of reduced speed.

Figure 5:
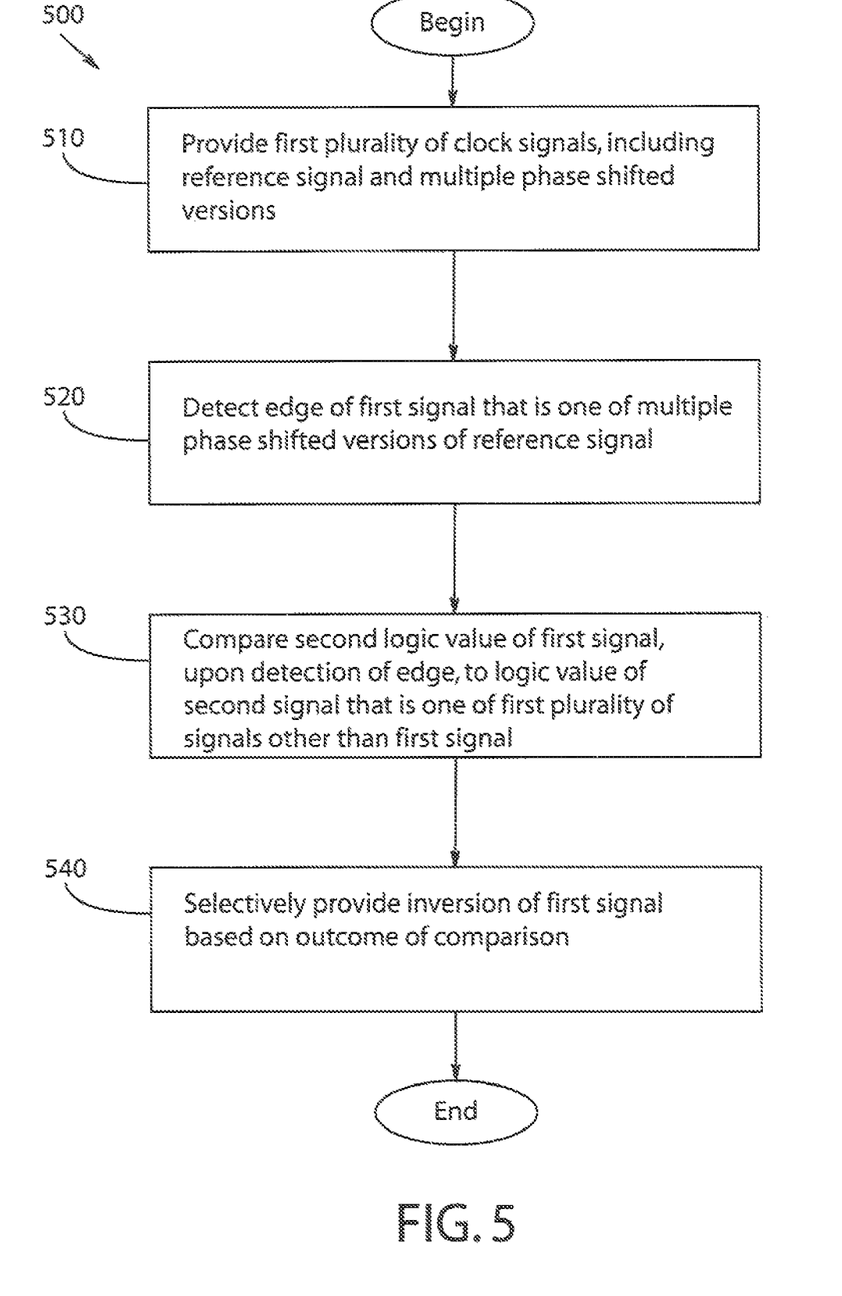
FIG. 5 is a flow diagram of a process in accordance with various embodiments.

FIG. 5 is a flow diagram in accordance with various embodiments. After process 500 begins, multiple periodic clock signals are provided (510), including a reference signal (e.g., signal LF0 or LF180 described above) and multiple phase shifted versions of the reference signal (e.g., LF45, LF90, and LF135, or LF225, LF270 and LF315). The signals have a common frequency and are shifted from one another by multiples of a phase offset (e.g., 45 degrees). An edge of a first signal (e.g., LF135) is detected (520). The first signal is one of multiple phase shifted versions of the reference signal. The edge is a transition from a first logic value to a second logic value, e.g., a rising edge from low ('0') to high ('1'). The second logic value of the first signal is compared (530), upon detection of the edge, to a logic value of a second signal that is one of the periodic clock signals other than the first signal (e.g., compared to LF0). An inversion of the first signal is selectively provided (540) based on an outcome of the comparison.

Figure 6:
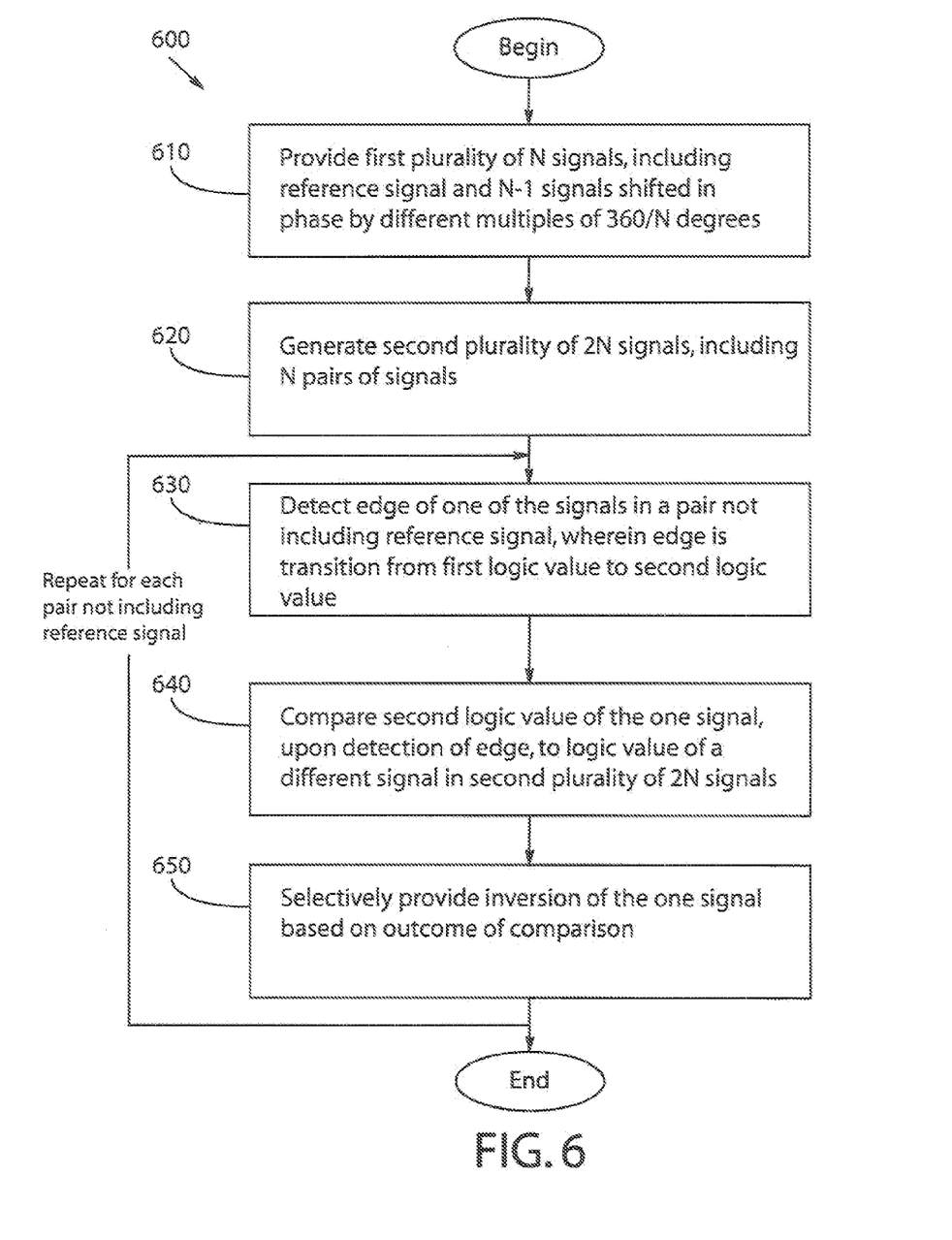
FIG. 6 is a flow diagram of a process in accordance with various embodiments.

FIG. 6 is a flow diagram in accordance with various embodiments. After process 600 begins, a first plurality of N (e.g., N=4) periodic clock signals are provided (610), including a reference signal (e.g., HF0) and N−1 signals (e.g., HF90, HF180, and HF270) shifted in phase from the reference signal by different multiples of 360/N degrees. A second plurality of 2N signals (e.g., LF0, LF45, LF90, LF135, LF180, LF225, LF270, and LF315) are generated (620), including N pairs of signals, where each pair corresponds to one of the signals of the first plurality. For example, LF<X/2> and LF<X/2+180> may be generated based on HF<X>, where X ranges over the set {0, 90, 180, 270}. Each signal in the second plurality has double the period of the signals of the first plurality. The two signals in each pair are inverted versions of each other, and each signal in the first plurality has a rising edge aligned with a rising edge of one of the signals of the corresponding pair. For each pair that does not include the reference signal, an edge of one of the signals in that pair is detected (630), where the edge is a transition from a first logic value (e.g., '0') to a second logic value (e.g., '1'), and the second logic value of said one signal in said pair is compared (640), upon detection of the edge, to a logic value of a different signal in the second plurality of 2N signals. For each pair that does not include the reference signal, an inversion of said one signal in said pair is selectively provided (650) based on an outcome of the comparison. For example, an inversion of LF135 (e.g., LF315) may be provided if the comparison indicates that LF135 does not conform to the desired 135 degree phase offset relative to LF0.

An embodiment is a phase calibration apparatus for processing a subset of a first plurality of periodic clock signals. The first plurality of periodic clock signals (e.g., LF0, LF45, LF90, LF135, LF180, LF225, LF270, and LF315) includes a reference signal and multiple phase shifted versions of the reference signal. The signals in the first plurality have a common frequency and are shifted from one another by multiples of a phase offset (e.g., 45 degrees). The apparatus (e.g., phase calibration module 160-1) includes a phase detector (e.g., comprising DFF 162-1) and a phase selector (e.g., comprising muxes 164a-1 and 164b-1). The subset (e.g., LF0, LF135, and LF315) may include some or all of the signals in the first plurality. The phase detector is configured to detect an edge of a first signal (e.g., LF135) in the subset. The first signal is one of multiple phase shifted versions of the reference signal. The edge is a transition from a first logic value to a second logic value. The phase detector is further configured to provide, upon detection of the edge, a logic value of a second signal (e.g., LF0) that is a signal from the subset other than the first signal. The phase selector is configured to compare the second logic value of the first signal, upon detection of the edge, to the logic value of the second signal, to determine whether the first and second signals have a predetermined phase relationship. The predetermined relationship between LF0 and LF135 may be that LF135 trails LF0 by 135 degrees. The predetermined relationship between other LF signals may be that they conform to the phase sequencing described above, in which LF45 trails LF0 by 45 degrees, LF90 trails LF0 by 90 degrees, etc. The phase selector is also configured to selectively provide an inversion of the first signal if the first and second signals do not have the predetermined phase relationship.

A method for signal phase calibration includes providing multiple periodic clock signals, including a reference signal and multiple phase shifted versions of the reference signal. The signals have a common frequency and are shifted from one another by multiples of a phase offset. An edge of a first signal is detected. The first signal is one of multiple phase shifted versions of the reference signal. The edge is a transition from a first logic value to a second logic value. The second logic value of the first signal is compared, upon detection of the edge, to a logic value of a second signal that is one of the first plurality of periodic clock signals other than the first signal. An inversion of the first signal is selectively provided based on an outcome of the comparison.

An embodiment is a phase calibration apparatus for processing a subset of a first plurality of periodic clock signals. The first plurality of periodic clock signals includes a reference signal and multiple phase shifted versions of the reference signal. The signals in the first plurality have a common frequency and are shifted from one another by multiples of a phase offset. The apparatus includes a phase detector and a phase selector. The phase detector is configured to detect an edge of a first signal in the subset. The first signal is one of multiple phase shifted versions of the reference signal. The edge is a transition from a first logic value to a second logic value. The phase detector is further configured to provide, upon detection of the edge, a logic value of a second signal that is a signal from the subset other than the first signal. The phase selector is configured to compare the second logic value of the first signal, upon detection of the edge, to the logic value of the second signal, to determine whether the first and second signals have a predetermined phase relationship. The phase selector is also configured to selectively provide an inversion of the first signal if the first and second signals do not have the predetermined phase relationship.

A method for signal phase calibration includes providing a first plurality of N periodic clock signals, including a reference signal and N−1 signals shifted in phase from the reference signal by different multiples of 360/N degrees. The method includes generating a second plurality of 2N signals, including N pairs of signals, where each pair corresponds to one of the signals of the first plurality. Each signal in the second plurality has double the period of the signals of the first plurality. The two signals in each pair are inverted versions of each other, and each signal in the first plurality has a rising edge aligned with a rising edge of one of the signals of the corresponding pair. For each pair that does not include the reference signal, an edge of one of the signals in that pair is detected, where the edge is a transition from a first logic value to a second logic value, and the second logic value of said one signal in said pair is compared, upon detection of the edge, to a logic value of a different signal in the second plurality of 2N signals. For each pair that does not include the reference signal, an inversion of said one signal in said pair is selectively provided based on an outcome of the comparison.

Although examples are illustrated and described herein, embodiments are nevertheless not limited to the details shown, since various modifications and structural changes may be made therein by those of ordinary skill within the scope and range of equivalents of the claims.

What is claimed is:
1. A method for signal phase calibration, the method comprising the steps of:
providing a first plurality of periodic clock signals, including a reference signal and multiple phase shifted versions of the reference signal, wherein the signals have a common frequency and are shifted from one another by multiples of a phase offset;
detecting an edge of a first signal, the first signal being one of multiple phase shifted versions of the reference sig- nal, wherein the edge is a transition from a first logic value to a second logic value;

comparing the second logic value of the first signal, upon detection of the edge, to a logic value of a second signal, the second signal being one of the first plurality of periodic clock signals other than the first signal; and selectively providing an inversion of the first signal based on an outcome of the comparing step.

2. The method of claim 1, wherein the first plurality of periodic signals includes the reference signal and first, second, and third phase shifted signals shifted from the reference signal in phase by 45 degrees, 90 degrees, and 135 degrees, respectively.

3. The method of claim 1, wherein the second signal is the reference signal.

4. The method of claim 1, wherein the inversion of the first signal is provided based on the comparison indicating that the second logic value of the first signal is different from the logic value of the second signal.

5. The method of claim 1, wherein N signals are provided in the first plurality, including N/2 pairs of signals, the two signals in each pair being inverted versions of one another, and wherein the phase offset is 360/N degrees.

6. The method of claim 5, further including providing an inversion of the other signal of the pair comprising the first signal.

7. The method of claim 5, further including:
for each pair not comprising the reference signal and not comprising the first signal:
  detecting an edge of one of the signals in said pair, wherein the edge is a transition from a first logic value to a second logic value,
  comparing the second logic value of said one signal, upon detection of the edge, to a logic value of another signal in the first plurality, and
  selectively providing an inversion of said one signal based on an outcome of the comparing step.

8. The method of claim 5, further including processing each signal of a second plurality of N/2 signals to generate a corresponding signal pair of the first plurality;
wherein each signal in the second plurality has twice the frequency of the signals of the first plurality and has a transition, from the first logic value to the second logic value, aligned with a transition, from the first logic value to the second logic value, of one of the signals of said corresponding pair.

9. A phase calibration apparatus for processing a subset of a first plurality of periodic clock signals, the first plurality of periodic clock signals including a reference signal and multiple phase shifted versions of the reference signal, wherein the signals in the first plurality have a common frequency and are shifted from one another by multiples of a phase offset, said apparatus comprising:
a phase detector configured to:
  detect an edge of a first signal in the subset, the first signal being one of multiple phase shifted versions of the reference signal, wherein the edge is a transition from a first logic value to a second logic value, and
  upon detection of the edge, provide a logic value of a second signal, the second signal being a signal from the subset other than the first signal; and
a phase selector configured to:
  compare the second logic value of the first signal, upon detection of the edge, to the logic value of the second signal, to determine whether the first and second signals have a predetermined phase relationship, and
  selectively provide an inversion of the first signal if the first and second signals do not have the predetermined phase relationship.

10. The apparatus of claim 9, wherein the first plurality includes the reference signal and phase shifted signals shifted from the reference signal in phase by 45 degrees, 90 degrees, 135 degrees, 225 degrees, 270 degrees, and 315 degrees, respectively; and the subset includes the reference signal and the phase shifted signals shifted in phase by 135 degrees and 315 degrees, respectively.

11. The apparatus of claim 9, wherein said phase detector includes a flip flop having the second signal as a data input, said flip flop being triggered by the edge of the first signal.

12. The apparatus of claim 9, wherein the second signal is the reference signal.

13. The apparatus of claim 9, wherein said phase selector is configured to provide the inversion of the first signal based on the comparison indicating that the second logic value of the first signal is different from the logic value of the second signal.

14. The apparatus of claim 9, wherein the first plurality includes N signals, the first plurality includes N/2 pairs of signals, the two signals in each pair are inverted versions of one another, and the phase offset is 360/N degrees.

15. The apparatus of claim 14, wherein said phase selector includes a multiplexor configured to receive the first signal as a first input and the other signal of the pair including the first signal as a second input.

16. The apparatus of claim 14, wherein said phase selector is further configured to provide an inversion of the other signal of the pair comprising the first signal.

17. The apparatus of claim 14, comprising N/2−1 of said phase detectors and N/2−1 of said phase selectors organized in at least N/2−1 stages, each stage including a phase detector and a phase selector.

18. The apparatus of claim 17, wherein said stages are organized in a predetermined order, and one of the stages includes a logic module configured to detect an inversion provided by the phase selector of a stage that is a predecessor to said one stage.

19. The apparatus of claim 18, wherein said logic module includes a logical exclusive-nor (XNOR) gate configured to:
  receive, at a first input, the logic value of the second signal of said predecessor stage,
  receive, at a second input, the logic value of the second signal of said one stage, and
  generate an indication of the inversion provided by the phase selector of said predecessor stage.

20. The apparatus of claim 17, wherein said stages are organized in a predetermined order, and the phase detector of one of the stages is configured to receive an inversion signal provided by the phase selector of a stage that is a predecessor to said one stage.

21. The apparatus of claim 9, further including a divider circuit configured to:
  receive an input signal having twice the frequency of the signals of the first plurality, and
  generate said first signal and a complement signal, shifted 180 degrees in phase from said first signal, based on said input signal;
  wherein each edge of said first signal and each edge of said complement signal coincide in time with corresponding edges of said input signal.

22. A method for signal phase calibration, the method comprising the steps of:

providing a first plurality of N periodic clock signals, including a reference signal and N−1 signals shifted in phase from said reference signal by different multiples of 360/N degrees;

generating a second plurality of 2N signals, including N pairs of signals, each pair corresponding to one of the signals of the first plurality, wherein each signal in the second plurality has double the period of the signals of the first plurality, the two signals in each pair are inverted versions of each other, and each signal in the first plurality has a rising edge aligned with a rising edge of one of the signals of the corresponding pair; and for each pair that does not include the reference signal,
  detecting an edge of one of the signals in said pair, wherein the edge is a transition from a first logic value to a second logic value,
  comparing the second logic value of said one signal in said pair, upon detection of the edge, to a logic value of a different signal in the second plurality of 2N signals, and
  selectively providing an inversion of said one signal in said pair based on an outcome of the comparing step.

23. The method of claim 22, wherein the first plurality includes four periodic clock signals, including the reference signal and phase shifted signals shifted from the reference signal in phase by 90 degrees, 180 degrees, and 270 degrees; and the second plurality includes four pairs of signals, wherein the signals in the second plurality are shifted in phase from one another by multiples of 45 degrees.

* * * * *